United States Patent [19]

Van Ast

[11] Patent Number: 5,739,268
[45] Date of Patent: Apr. 14, 1998

[54] PREPARATION OF CYANATE ESTER POLYMERS AND COMPOSITES FOR METAL PLATING

[75] Inventor: Camille I. Van Ast, Newbury Park, Calif.

[73] Assignee: Hughes Aircraft, Los Angeles, Calif.

[21] Appl. No.: 638,694

[22] Filed: Apr. 26, 1996

Related U.S. Application Data

[63] Continuation of Ser. No. 339,380, Nov. 14, 1994, abandoned.

[51] Int. Cl.$^6$ .................................. B05D 3/00; C08J 7/00
[52] U.S. Cl. .................... 528/492; 528/495; 528/499; 427/306; 427/443.1; 427/444
[58] Field of Search ...................... 528/492, 499, 528/495; 422/306, 443.1, 444

[56] References Cited

U.S. PATENT DOCUMENTS

| | | | |
|---|---|---|---|
| 3,642,584 | 2/1972 | Quinn et al. | 427/306 |
| 3,716,394 | 2/1973 | Waggoner et al. | 427/306 |
| 3,791,848 | 2/1974 | DeAngelo | 427/306 |
| 4,422,907 | 12/1983 | Birkmaier et al. | 427/306 |
| 5,286,530 | 2/1994 | Karas et al. | 427/306 |
| 5,300,735 | 4/1994 | Yokono et al. | 428/901 |
| 5,320,919 | 6/1994 | Azuma et al. | 428/607 |
| 5,443,865 | 8/1995 | Tisdale et al. | 427/306 |

OTHER PUBLICATIONS

Aldrich Chemical Co., Eastman Kodak Co. and Acros Organics Catalogs, 22 miscellaneous pages (1986).
Shipley Circuposit 3000 Process (1988).
"Chemical Treatments Designed to Improve Adhesion of Metals Deposited on the Surface of Cyanate Ester Composites", communication from Ciba-Geigy Corporation dated Jan. 1994.

*Primary Examiner*—Andrew E. C. Merriam
*Attorney, Agent, or Firm*—V. D. Duraiswamy; W. K. Denson-Low

[57] ABSTRACT

A method is provided for preparing the surface of a cyanate ester polymer or composite for metal plating. The surface is treated with a preheated solution containing a compound selected from the group consisting of at least one quaternary ammonium hydroxide and at least one primary amine. The method of the invention operates to improve adhesion between the treated surface and a subsequently plated metal, such that the resulting cyanate ester polymer or composite may replace certain metallic components in such applications as aircraft, spacecraft, and automobiles given its highly conductive metallic coating.

20 Claims, No Drawings

PREPARATION OF CYANATE ESTER POLYMERS AND COMPOSITES FOR METAL PLATING

This is a continuation of application Ser. No. 08/339,380, filed Nov. 14, 1994 now abandoned.

BACKGROUND OF THE INVENTION

1. Field of the Invention

The present invention is directed to providing non-metallic polymers and composites with a conductive surface, and more particularly, to preparing the surface of a cyanate ester polymer or composite for plating with metal.

2. Description of Related Art

Metals are commonly employed in manufacturing because they offer high degrees of ductility and strength as well as high conductivity. However, metals are generally heavier than other common materials like plastics, such that the positive characteristics attributable to metals often come at the cost of increased product weight. Increased product weight is particularly a concern in industries manufacturing vehicles of transport such as automobiles, aircraft, and spacecraft, as well as payloads of such vehicles, given that increased weight adversely affects fuel economy. Accordingly, these industries have increasingly incorporated non-metallic, lighter-weight materials such as plastics into automobiles and aircraft in an effort to economize fuel.

However, plastics are not universally suitable as substitutes for metals. For example, while plastics offer high degrees of ductility and strength, plastics are relatively non-conductive materials. Thus, plastics cannot supplant metals used as electrical, thermal, or microwave conductors.

It would be desirable to plate a metal coating onto non-metallic plastic, thereby simultaneously realizing the benefits of both metals and plastics. More specifically, metal plating on such commonly-used plastic materials as cyanate esters and cyanate ester composites would allow the use of these lighter-weight plastic materials for the bulk of components and would minimize the amount of metal required to achieve a highly conductive surface. However, plating metal onto untreated plastic surfaces has been unsuccessful because these materials do not inherently adhere to one another.

There are methods available to improve the adhesion between metals and certain non-metallic surfaces. One such process, commercially available from Shipley Chemicals, employs a series of treatment baths to clean, texturize, neutralize, condition, and etch the resin surfaces of circuit board composites in preparation for electroless copper processing. For example, the Shipley process employs an alkaline permanganate bath to texturize the resin surface and a persulfate-based micro-etch system to promote adhesion of the copper to the resin surface. While the Shipley process improves adhesion between copper and resin surfaces, its applicability to the metal plating of such plastics as cyanate ester polymers is unknown. Further, the multi-step process of Shipley is cumbersome, requiring many steps and numerous chemical compounds. In sum, there is no known technology specifically addressed to inducing the adhesion of metals onto the surfaces of cyanate ester polymers and composites.

Thus, a need remains for a method to improve adhesion of a metal coating to cyanate ester polymers and composites. The method should consist of a minimal number of steps so that production rates may be optimized. The present invention fulfills these needs.

SUMMARY OF THE INVENTION

In accordance with the invention, a method is provided to prepare the surface of a cyanate ester polymer or composite for metal plating such that the metal adequately adheres to the polymer or composite surface. For purposes of brevity, the term "cyanate ester polymer" is hereinafter intended to encompass both "cyanate ester polymer" and "cyanate ester polymer composite". The method of the invention consists essentially of:

(a) providing a polymer comprising a cyanate ester, the polymer having a surface;

(b) placing the surface in contact with a preheated solution comprising a compound selected from the group consisting of at least one quaternary ammonium hydroxide and at least one primary amine;

(c) removing the surface from contact with the preheated solution;

(d) rinsing the surface with water; and (e) drying the surface, the surface thereby having been prepared to adhere to metal deposited by a subsequent metal plating process.

In sum, a method is provided to enable the successful metal plating of a cyanate ester polymer, such that a highly conductive surface may be constructed on the polymer. As a result, the method of the present invention enables industry to replace metallic components with lighter-weight cyanate ester polymer components, given that these components may now be equipped with the requisite highly conductive surface.

The present invention is expected to have a positive economic impact on the automotive, aircraft, and spacecraft industries. The replacement of metallic compounds with lighter-weight cyanate ester polymer components reduces total product weight, which leads to greater fuel efficiency in vehicles of transport. For example, each pound of weight eliminated from a satellite is estimated to save approximately $30,000 (in 1993 dollars) in the deployment and operation of satellites.

Accordingly, the method of the present invention offers a practical, effective method to prepare the surface of a cyanate ester polymer for metal plating and to thereby enable the substitution of such polymers for heavier metallic components.

DETAILED DESCRIPTION OF THE PREFERRED EMBODIMENTS

The present invention is directed to preparing the surface of a cyanate ester polymer for plating with metal. More specifically, the method of the present invention involves treating the polymer surface such that better adhesion is achieved between the plated metal and the polymer.

While the method of the invention may serve to adequately prepare the surface of various polymers and polymer composites, it is specifically designed to treat the surface of cyanate ester polymers and composites. Four examples of cyanate ester polymers benefited by the practice of the invention include cyanate ester polymer RS3 available from YLA, cyanate ester polymer BTCY-1 available from Bryte, cyanate polymer X1515 available from Bryte, and cyanate ester polymer 954-3 available from Fiberite. Examples of graphite fibers combined with cyanate ester polymers to form composites suitably employed in the practice of the invention include XN-80 carbon fibers available from YLA and T300 carbon fibers available from Fiberite.

In the practice of the invention, the surface of the polymer is placed in contact with a preheated solution comprising a compound having nitrogen-based group, the surface preferably being immersed in the solution. More specifically, the preheated solution comprises either a quaternary ammonium hydroxide ($R_4$—NOH) or a primary amine (R—$NH_2$), where R may be represented by an alkyl group, an aryl-alkyl group, a hydroxy-alkyl group, or an alkoxy-alkyl group.

If a quaternary ammonium hydroxide is chosen to serve as the preheated solution, it may be represented by such compounds as tetrabutylammonium hydroxide, benzyltrimethylammonium hydroxide, tetramethylammonium hydroxide, tetraethylammonium hydroxide, tetrapropylammonium hydroxide, tetrapentylammonium hydroxide, tetrahexylammonium hydroxide, and (2-hydroxyethyl) trimethyl ammonium hydroxide, which is also known as choline. Preferably, the alkyl groups employed in the practice of the invention have chain lengths ranging from one to six carbon atoms. Each of these quaternary ammonium hydroxide compounds is commercially available. In the practice of the invention, quaternary ammonium hydroxide is effective at a concentration ranging from as little as 4 wt % to full commercial strength.

Alternatively, a pre-heated primary amine solution may serve to provide adhesion between plated metal and cyanate ester polymers. Secondary and tertiary amines are not suitable in the practice of the invention because they either react extremely slowly or not at all (see Examples 9 and 10, below). Primary amines suitably employed in the practice of the invention must have a boiling point ("BP") significantly higher than the operating temperature of the solution, which is preferably maintained at a temperature between 80° C. and 125° C. Examples of suitable primary amines include triethylenetetraamine (BP≅266° C.), hexanediamine (BP≅204° C.), octylamine (BP≅175° C.), and ethylenediamine (BP≅118° C.). Other primary amines believed suitable for the practice of the invention include diethylenetriamine, tetraethylenepentaamine, 1,7-diaminoheptane, 2-methyl-1,5-pentanediamine, 1,5-pentanediamine, 1,3-propanediamine, 1,2-propanediamine, 1,4-butanediamine, pentylamine, hexylamine, heptylamine, octylamine, nonylamine, and decylamine. Notably, triethylenetetraamine has both primary and secondary amine groups, but the secondary amine groups are not believed to contribute significantly to texturizing the polymer surface. Each of these primary amines is commercially available. Preferably, the highest commercially-available grade of the primary amine is employed without dilution in the practice of the invention. While a preheated solution comprising a lesser-grade, diluted primary amine would in all likelihood effect some degree of the desired treatment, higher-grade primary amines that are not diluted are more effective as preheated solutions. Typically, primary amines are commercially available at 95% purity or greater. In fact, with the exception of triethylenetetramine and tetraethylenepentamine, the above examples of suitably-employed primary amines are each commercially available from, for example, Aldrich Chemical Co., at 95% purity or greater. However, for some primary amines, "technical grade" material is the highest concentration readily available commercially. For example, triethylenetetraamine is commercially available from Aldrich at only 60% purity, and tetraethylenepentamine is commercially available from Eastman Kodak Co. at only 80% purity. In sum, it is preferable in the practice of the invention to employ a primary amine that is available at 95% purity or greater, and to employ such a primary amine without dilution, i.e., at its full commercial strength, as the preheated solution in the practice of the invention.

The temperature of the solution is preferably maintained at a temperature within the range of about 80° to 125° C., with the most preferable temperature depending upon the particular cyanate ester polymer being treated. At temperatures less than 80° C., the adhesion achieved in the practice of the invention may be less than optimal, although Example 7 illustrates that a temperature as low as 23° C., which is roughly room temperature, may be adequate in some cases. On the other hand, at temperatures greater than 125° C., the chemical reaction rate is greatly accelerated so that the process may be uncontrollable.

Optionally, the cyanate polymer surface may be pre-treated to soften and clean the surface in preparation for immersion in the preheated solution. Example 1 illustrates pre-treating a composite with the solvent toluene prior to immersion in a quaternary ammonium hydroxide solution. Another solvent which may serve in a pretreating capacity is acetone, which among many other solvents is suitable to soften and clean a polymer surface prior to treatment.

Another option involves employing solvents within the preheated solution itself. Example 8 illustrates the use of the solvent ethoxyethanol with a primary amine, while Examples 13 and 15 illustrate the use of propanediol and pyrrolidone, respectively, with an ammonium hydroxide solution. Such solvents may be employed in the present preheated solution for various purposes, including to dissolve decomposition products formed in the practice of the invention; to dilute the preheated solution (as in Example 8); to swell the undecomposed portion of the resin; and to smooth the surface of the resin. Alternatively, as illustrated in Example 17 with the solvent methyl isobutyl ketone, a solvent may also be employed after the resin has been treated to achieve a smoother resin surface and to partially redissolve decomposition products.

In the practice of the invention, the polymer surface remains immersed in the preheated solution for at least 15 seconds. Preferably, the polymer remains immersed for a period of time ranging from 15 seconds to 20 minutes. An immersion of less than 15 seconds does not adequately prepare the surface for metal plating, while an immersion lasting more than 20 minutes dissolves an excessive amount of polymer, resulting in loss of adhesion as well as the exposure of carbon fibers in composites.

At the conclusion of the immersion step, the polymer surface is removed from the preheated solution, rinsed with water (preferably deionized), and dried. The drying step is preferably accomplished either by allowing the polymer surface to air-dry at room temperature or by blowing the polymer surface dry with a stream of nitrogen. Once dry, the polymer surface is fully prepared for metal plating and may be plated at any time for up to one week.

The method used to perform the metal plating on the polymer surface does not form part of the invention and may be accomplished by any of the conventional processes known in the art, such as electroplating, electroless chemistry, and sputtering. One traditional method entails four basic sequential steps and utilizes both electroless chemistry and electroplating. First, the polymer surface is treated with an acidic solution of palladium chloride and stannous chloride. This acidic solution is available commercially; for example, it is sold under the trade name Cataposit 44 by Shipley. Second, the polymer surface is treated with a hydrochloric acid accelerator, such as commercially-available Accelerator No. 19 from Shipley. Third, the polymer surface is treated with an either a nickel or a copper electroless plating solution. An electroless nickel plating solution is prepared by combining 150 ml of Solution A with 100 ml of Solution B, both of which are commercially available from Allied Kelite, and then diluting the 250 ml to 1 L with water. Alternatively, an electroless copper solution can be prepared by mixing Enplate Cu-700A (6% by volume), Enplate Cu-700B (6% by volume), Enplate Cu-700C (2.25% by volume), and water. Fourth, and finally, the polymer surface is electroplated with a metal aside from the one contained in the electroless plating solution, such as silver. Optionally, the metal plated polymer surface may then be baked to further harden the metal coating. At the conclusion of the metal plating process, a metal coating will have been applied to the polymer surface, thereby providing the polymer with a highly conductive surface.

The precise mechanism behind the improved quality of adhesion attained in the practice of the invention between a cyanate ester polymer and plated metal is not known. Without subscribing to any particular theory, it appears that the hydroxyl ion of the quaternary ammonium hydroxide attacks the polymer surface, while the nitrogen in the amine groups of the triethylenetetraamine wages a nucleophilic attack on the polymer surface.

The method of the invention provides for adhesion between cyanate ester polymers and metal deposited by plating, thereby enabling the formation of a highly conductive surface on cyanate ester polymers and composites. The adhesion attained in the practice of the invention is generally very good according to ASTM method D3359-92a performance standards, as discussed in detail in the Examples below.

EXAMPLES

Unless otherwise expressly indicated, the adhesion of the films in the following examples was tested according to ASTM method D3359-92A, which is specifically used to assess the adhesion of coating films to metallic substrates by applying and removing pressure-sensitive tape over cuts made in the film. In accordance with this standard test, the films were first cut in a cross-hatch fashion using a knife, with six ¾-inch long cuts in one direction spaced 2 mm apart and with another six similarly-spaced ¾-inch cuts perpendicular over the first six. Following removal of loose pieces of film, a pressure-sensitive tape ranging from three to four inches in length was placed over the crosshatching, with the applied tape being rubbed with a pencil eraser to set it. After waiting from one to two minutes, the tape was removed by seizing the free end and pulling the tape back upon itself at approximately a 180° angle. The cross-hatched film was then visually compared to illustrations for grading the adhesion on a scale of 0 to 5. Two types of tape were typically used to test the adhesiveness, namely a 135-oz/inch tape and a 40-oz/inch tape, commercially available as 3M 300 and 3M 853 tape, respectively.

Certain examples were tested before the inventor had precise knowledge of how the ASTM test should be conducted, namely with respect to the precise crosshatch pattern to be used as well as the particular tape to be employed. However, a test was conducted with considerable similarity to the ASTM method D3359-92A test. More specifically, a standard platers adhesion test was conducted. First, a crosshatch was cut into the film, then a 3M-4130 platers mask off tape was applied to the cross-hatched area. Upon removal of the tape, the film was visually inspected with grading similar to that conducted under the ASTM method. Examples 4 and 13–20 were conducted according to this test procedure.

Examples 1–8 illustrate various embodiments of the method of the invention with regard to a composite molded from cyanate ester polymer RS3 and XN-80 carbon fibers, both commercially available from YLA:

Example 1

The composite was first dipped into toluene for about 1 minute. The composite was then treated with an aqueous solution containing approximately 40% tetrabutylammonium hydroxide, the solution having been preheated to about 90° C. The composite remained immersed in the solution for a period of 10 minutes. The composite was then removed from the solution and rinsed with water in a beaker for about 1 minute. Finally, the composite was blown dry with a stream of nitrogen. A microscopic examination of the treated composite surface at this point revealed a roughened whitish surface with microcracks.

Upon completion of the method of the invention, the composite was subjected to a conventional metal plating process. The composite was dipped in Cataposit 44 at room temperature for about 15 minutes, rinsed in water for about 15 seconds, dipped in Accelerator No. 19 at room temperature for about 15 minutes, rinsed again with water for about 15 seconds, and plated with electroless nickel for about 15 minutes at 92° C. The nickel deposition was carried out until a continuous coating of nickel was observed on the composite surface. The length of time required to achieve a continuous coating varied with the prior usage of the nickel solution, the quantity of nickel solution, and the size of the sample.

After rinsing the nickel-coated composite in a stream of water for about 15 seconds, the composite surface was immediately plated with silver in a silver strike solution (described below as Solution Y) at room temperature and a current density of 10 amps/ft$^2$. After about three seconds, plating was continued in a traditional silver cyanide plating bath (described below as Solution X) for about 5 to 15 minutes at 5 amps/ft$^2$. Finally, the plated composite surface was rinsed in flowing water and baked for about 20 to 30 minutes at 150° C.

The adhesion of the metal coating was tested according to ASTM method D3359-92a. The adhesion was classified as being between 4 and 5, the two categories characterizing the strongest adhesion.

Solution X: This solution was prepared by combining 20 g/l of silver in the form of $KAg(CN)_2$; 80 g/l of free KCN; and 15 g/l of $K_2CO_3$.

Solution Y: This solution was prepared by diluting 25 ml of Solution X (described above) to 100 ml with water.

Example 2

The composite was treated with an aqueous solution containing approximately 40% tetrabutylammonium hydroxide, the solution having been preheated to about 90° C. The composite remained immersed in the solution for a period of 10 minutes. The composite was then removed from solution, rinsed with water, dried, and then plated as described in Example 1.

The adhesion of the metal to the composite was tested according to ASTM method D3359-92a with an adhesive tape after crosshatching the coating. The adhesion was considered very good, having been rated between 4 and 5 with a tape of 20 oz/inch and 3 with a tape of 135 oz/inch.

Example 3

The composite was treated with a 25% solution of tetramethylammonium hydroxide in water, the solution having been preheated to about 100° C. The composite remained immersed in the solution for a period of 10 minutes. The composite was then removed from the solution and rinsed with water at room temperature for about 30 seconds. Finally, the composite was allowed to air-dry at room temperature.

Upon completion of the practice of the invention, the composite was subjected to a conventional metal plating process similar to that described in Example 1, except that electroless copper was plated instead of nickel. The composite was dipped in Cataposit 44 at room temperature for about 15 minutes, rinsed in water for about 15 seconds, dipped in Accelerator No. 19 at room temperature for about 15 minutes, rinsed again with water for about 15 seconds, and plated with electroless copper for about 15 minutes at room temperature. The electroless copper solution was prepared by mixing Enplate Cu-700A (6% by volume), Enplate Cu-700B (6% by volume), Enplate Cu-700C (2.25% by volume), and water.

After rinsing the copper-coated composite in a stream of water for about 30 seconds, the composite surface was immediately plated with silver and rinsed again as described in Example 1. The metal-plated composite was then baked for 30 minutes at 150° C.

The adhesion of the metal to the composite was tested with an adhesive tape after crosshatching the coating. The adhesion rated between 2 and 3 according to ASTM method D3359-92a following testing with 135-oz/inch tape.

Example 4

The composite was dipped into triethylenetetraamine preheated to 105° C. The composite remained immersed 30 seconds. The composite was then removed from the solution, rinsed with water in a beaker for about 1 minute, and blown dry with a stream of nitrogen. The composite was subjected to a conventional metal plating process, similar to that described in Example 1.

The adhesion of the metal coating was tested using 3M 4130 platers mask-off tape as applied to crosshatching. The adhesion was classified as being between 4 and 5, the two categories characterizing the strongest adhesion.

Example 5

The composite was immersed in molten 1,6-hexanediamine, a compound having only primary amine groups. The composite remained immersed 30 seconds in the solution, which had been preheated to 80° C. The composite was then removed from the solution, rinsed with water in a beaker for about 1 minute, and blown dry with a stream of nitrogen. The composite was subjected to a conventional metal plating process, similar to that described in Example 1.

The adhesion of the cross-hatched metal coating was tested according to ASTM method D3359-92a with a 135-oz/inch tape. The adhesion was classified as category 5, the category characterizing the best and strongest adhesion.

Example 6

The composite was immersed in octylamine, a monofunctional primary amine. The composite remained immersed 2.0 minutes, with the solution having been preheated to 80° C. The composite was then removed from the solution, rinsed with water in a beaker for about 1 minute, and blown dry with a stream of nitrogen. The composite was then plated with electroless copper than silver, similar to that described in Example 3.

The adhesion of the metal coating was tested according to ASTM method D3359-92a using a 135-oz/inch tape. The adhesion was classified as being between 4 and 5, the two categories characterizing the strongest adhesion.

Example 7

The composite was dipped into a 1:1 mixture of two primary amines, namely triethylenetetraamine and ethylenediamine. This solution was not preheated and remained at room temperature, or approximately 23° C. The composite remained immersed 10 minutes. The composite was then removed from the solution, rinsed with water in a beaker for about 1 minute, and blown dry with a stream of nitrogen. The composite was subjected to a conventional metal plating process, similar to that described in Example 1.

The adhesion of the metal coating was tested according to ASTM method D3359-92a using a 40-oz/inch tape. The adhesion was classified as a category 5, which is the strongest adhesion.

Example 8

The composite was dipped into 1:1 mixture of a primary amine and a solvent, namely triethylenetetraamine and 2-ethoxyethanol. The solution had been preheated to 80° C. The composite remained immersed 5 minutes. The composite was then removed from the solution, rinsed with water in a beaker for about 1 minute, and blown dry with a stream of nitrogen. The composite was subjected to a conventional metal plating process, similar to that described in Example 1.

The adhesion of the metal coating was tested according to ASTM method D3359-92a using a 135-oz/inch tape. The adhesion was classified as category 5, representing the strongest.

Examples 9–10 illustrate the failure of secondary and tertiary amines in providing adhesion between a plated metal and a composite molded from cyanate ester polymer RS3 and XN-80 carbon fibers, both commercially available from YLA:

Example 9

The composite was dipped into a solution of dihexylamine, a secondary amine. The solution had been preheated to 100° C. The composite remained immersed 42 minutes. The composite was then removed from the solution, rinsed with water in a beaker for about 1 minute, and blown dry with a stream of nitrogen. Upon examination under a microscope, the treated surface appeared unaffected by the treatment, as opposed to the roughened, cracked appearance in Example 1 following treatment. The composite was then subjected to a conventional metal plating process, similar to that described in Example 1.

The adhesion of the cross-hatched metal coating was tape-tested according to ASTM method D3359-92a. The adhesion was extremely poor, with the metal coming off in a single sheet.

Two similar tests were run using the secondary amines diethylamine and diethanolamine, wherein the composites were immersed for an entire hour in room temperature and at 100° C., respectively. In both cases, the plated metal had no adhesion to the composite.

Example 10

The composite was dipped into a solution of N,N,N'N'-tetramethylethylenediamine, a tertiary amine having only tertiary amino groups. The composite was immersed for 16 minutes at 60° C., then 5 minutes at 80° C., then 10 minutes at 90° C., and, finally, 4 minutes at 100°–105° C. The composite was then removed from the solution, rinsed with water in a beaker for about 1 minute, and blown dry with a stream of nitrogen. Upon examination under a microscope at 750× magnification, the treated surface appeared unaffected by the treatment, as opposed to the roughened, cracked appearance in Example 1 following treatment. An attempt was made to plate the sample as described in Example 1, and a nickel coating was obtained; however, during the subsequent silver plating process the metal coating floated off the composite surface.

Examples 11–12 illustrate various embodiments of the method of the invention with regard to a composite molded from cyanate ester polymer BTCY-1 and XN-80 carbon fibers, both commercially available from Bryte:

Example 11

The composite was treated with a 40% solution of tetrabutylammonium hydroxide in water, the solution having been preheated to about 90° C. The composite remained immersed in the solution for a period of 18 minutes. The composite was then removed from solution, rinsed with water, air-dried, and then plated as described in Example 1.

The adhesion of the metal to the composite was tested with an adhesive tape after crosshatching the coating. The adhesion was considered excellent, rating between 4 and 5 for both the 20-oz/inch and 135-oz/inch tapes.

Example 12

The composite was treated with a 40% solution of benzyltrimethylammonium hydroxide in water, the solution having been preheated to about 90° C. The composite remained immersed in the solution for a period of 15 minutes. The composite was then removed from solution, rinsed with water, air-dried, and then plated as described in Example 1.

The adhesion of the metal to the composite was tested with an adhesive tape after crosshatching the coating. The adhesion was considered excellent, rating a 5 according to ASTM method D3359-92a following testing with both 20-oz/inch and 135-oz/inch tapes.

Examples 13–14 illustrate various embodiments of the method of the invention with regard to a composite molded from cyanate ester polymer X1515 and XN-80 fibers, both commercially available from Bryte:

Example 13

The composite was dipped into AZ 300T, a commercial resist stripper from Hoechst Celanese containing 4% tetramethylammonium hydroxide, 55% 1,2-propanediol, and 41% 1-methyl-2-pyrrolidone. The stripper solution had been preheated to about 80° C. prior to immersion, and the composite remained immersed for about 2 minutes. The composite was then removed from solution, rinsed with water, air-dried, and then plated as described in Example 1.

The adhesion of the metal to the composite was tested with a 3M-4130 platers mask off adhesive tape after crosshatching the coating. The adhesion was considered excellent.

Example 14

The composite was dipped into triethylenetetraamine preheated to about 105° C. prior to immersion, and the composite remained immersed for about 1 minute. The composite was then removed from solution, rinsed with water, and air-dried. The composite was subjected to a conventional metal plating process, similar to that described in Example 1.

The adhesion of the metal to the composite was tested with a 3M-4130 platers mask off adhesive tape after crosshatching the coating. The adhesion was considered excellent.

Examples 15–20 illustrate various embodiments of the method of the invention with regard to a composite molded from cyanate ester polymer 954-3 and T300 carbon fibers, both commercially available from Fiberite:

Example 15

The composite was dipped into AZ 300T, a commercial resist stripper from Hoechst Celanese containing 4% tetramethylammonium hydroxide, 55% 1,2-propanediol, and 41% 1-methyl-2-pyrrolidone. The stripper solution had been preheated to about 95° C. prior to immersion, and the composite remained immersed for about 5 minutes. The composite was removed from solution, rinsed with water, air-dried, and then plated as described in Example 1.

The adhesion of the metal to the composite was tested with a 3M-4130 platers mask off adhesive tape after crosshatching the coating. The composite performed adequately.

Example 16

The composite was treated and plated as described as in Example 4. The adhesion of the metal to the composite was tested with a 3M-4130 platers mask off adhesive tape after crosshatching the coating. The adhesion was considered excellent.

Example 17

The composite was treated with triethylenetetraamine as described in Example 4. The treated substrate was then dipped into methyl isobutyl ketone for 20 seconds at room temperature, followed by a water rinse. The composite was then plated as described in Example 1.

The adhesion of the metal to the composite was tested with an 85-oz/inch adhesive tape after crosshatching the coating. The adhesion was considered excellent, and none of the metal coating was removed. The coating was also brushed vigorously with a metal brush without peeling the coating.

Example 18

The composite was treated similarly to Example 17 except that it was treated with triethylenetetraamine for 30 seconds at 90° C.

The adhesion of the metal to the composite was tested with an 85-oz/inch adhesive tape after crosshatching the coating. The composite performed well in the tape test.

Example 19

The composite was treated and plated as described as in Example 4, except that it was treated with triethylenetetraamine for 1.0 minute at 80° C.

The adhesion of the metal to the composite was tested with an 85-oz/inch adhesive tape after crosshatching the coating. The composite performed adequately in the tape test, but some of the coating peeled off when it was brushed vigorously with a metal brush.

Example 20

The composite was treated and plated as described as in Example 4, except that it was treated with triethylenetetraamine for 15 seconds at 125° C.

The adhesion of the metal to the composite was tested with a 3M-4130 platers mask off adhesive tape after crosshatching the coating. The composite performed adequately in the tape test after crosshatching, but some of the coating peeled off when it was brushed vigorously with a metal brush.

Thus, there has been disclosed a method for improving the adherence of plated metal to polymer surfaces. It will be readily apparent to those of ordinary skill in this art that various changes and modifications of an obvious nature may be made without departing from the spirit of the invention, and all such changes and modifications are considered to fall within the scope of the invention, as defined by the appended claims.

What is claimed is:

1. A method for preparing the surface of a cyanate ester polymer or cyanate ester polymer composite for plating with metal, consisting essentially of:
   (a) providing a polymer comprising a cyanate ester, said polymer having a surface;
   (b) placing said surface in contact with a preheated solution comprising at least one primary amine;
   (c) removing said surface from contact with said preheated solution;
   (d) rinsing said surface with water; and
   (e) drying said surface,
said surface thereby prepared to adhere to metal deposited by a subsequent metal plating process.

2. The method of claim 1 wherein said cyanate ester polymer composite comprises graphite fibers in a cyanate ester matrix.

3. The method of claim 1 wherein the temperature at which said preheated solution is maintained within the range of from about 80° to 125° C.

4. The method of claim 1 wherein said at least one primary amine is selected from the group consisting of triethylenetetraamine, hexanediamine, ethylenediamine, diethylenetriamine, tetraethylenepentaamine, 1,7-diaminoheptane, 2-methyl-1,5-pentanediamine, 1,5-pentanediamine, 1,3-propanediamine, 1,2-propanediamine, 1,4-butanediamine, pentylamine, hexylamine, heptylamine, octylamine, nonylamine, and decylamine.

5. The method of claim 4 wherein said at least one primary amine is selected from the group consisting of triethylenetetraamine, hexanediamine, octylamine, and ethylenediamine.

6. The method of claim 1 wherein said preheated solution further comprises at least one solvent selected from the group consisting of propanediol, pyrrolidone, and ethoxyethanol.

7. The method of claim 1 wherein said surface is immersed in said solution.

8. The method of claim 1 wherein said surface remains in contact with said preheated solution for at least 15 seconds.

9. The method of claim 8 wherein said surface remains in contact with said preheated solution for a period of time ranging from 15 seconds to 20 minutes in duration.

10. The method of claim 1 wherein drying said surface is accomplished by allowing said surface to air-dry at room temperature.

11. The method of claim 1 wherein drying said surface is accomplished by exposing said surface to a stream of nitrogen.

12. The method of claim 1 wherein said metal is selected from the group consisting of nickel and copper.

13. A method for preparing the surface of a cyanate ester polymer or cyanate ester polymer composite for plating with metal, consisting essentially of:
   (a) providing a material selected from the group consisting of a cyanate ester polymer and a cyanate ester composite, said cyanate ester composite comprising graphite fibers embedded in a cyanate ester polymer matrix, said material having a surface;
   (b) immersing said surface in a preheated solution comprising a compound selected from the group consisting of (a) at least one quaternary ammonium hydroxide at a minimum concentration of about 4 wt %, said at least one quaternary ammonium hydroxide selected from the group consisting of tetrabutylammonium hydroxide, benzyltrimethylammonium hydroxide, tetramethylammonium hydroxide, and (2-hydroxyethyl) trimethyl ammonium hydroxide, and (b) at least one primary amine, said preheated solution having a temperature within the range of about 80° to 125° C.;
   (c) removing said surface from contact with said preheated solution after a period of time ranging from about 15 seconds to 20 minutes in duration;
   (d) rinsing said surface with deionized water; and
   (e) drying said surface,
said surface thereby prepared to adhere to metal deposited by a subsequent metal plating process, the quality of adhesion ranging from about 3 to 5 as measured by ASTM method D3359-92A.

14. The method of claim 13 wherein said at least one primary amine is selected from the group consisting of triethylenetetraamine, hexanediamine, octylamine, and ethylenediamine.

15. The method of claim 13 wherein said preheated solution further comprises at least one solvent selected from the group consisting of propanediol, pyrrolidone, and ethoxyethanol.

16. The method of claim 13 wherein drying said surface is accomplished by allowing said surface to air-dry at room temperature.

17. The method of claim 13 wherein drying said surface is accomplished by exposing said surface to a stream of nitrogen.

18. The method of claim 13 wherein said metal is selected from the group consisting of nickel and copper.

19. A method for preparing the surface of a cyanate ester polymer or cyanate ester polymer composite for plating with metal, comprising:
   (a) providing a polymer comprising a cyanate ester, said polymer having a surface;
   (b) placing said surface in contact with a preheated solution comprising a compound selected from the group consisting of at least one quaternary ammonium hydroxide and at least one primary amine and further comprising at least one solvent selected from the group consisting of propanediol, pyrrolidone, and ethoxyethanol;
   (c) removing said surface from contact with said preheated solution;
   (d) rinsing said surface with water; and
   (e) drying said surface, said surface thereby prepared to adhere to metal deposited by a subsequent metal plating process.

20. A method for preparing the surface of a cyanate ester polymer or cyanate ester polymer composite for plating with metal, comprising:
   (a) providing a material selected from the group consisting of a cyanate ester polymer and a cyanate ester composite, said cyanate ester composite comprising graphite fibers embedded in a cyanate ester polymer matrix, said material having a surface;
   (b) immersing said surface in a preheated solution comprising a compound selected from the group consisting of at least one quaternary ammonium hydroxide and at least one primary amine, said preheated solution further comprising a solvent selected from the group consisting of propanediol, pyrrolidone, and ethoxyethanol, said preheated solution having a temperature within the range of about 80° to 125° C.;
   (c) removing said surface from contact with said preheated solution after a period of time ranging from about 15 seconds to 20 minutes in duration;
   (d) rinsing said surface with deionized water; and
   (e) drying said surface, said surface thereby prepared to adhere to metal deposited by a subsequent metal plating process, the quality of adhesion ranging from about 3 to 5 as measured by ASTM method D3359-92A.

* * * * *